(12) United States Patent
Klein

(10) Patent No.: US 8,775,137 B2
(45) Date of Patent: Jul. 8, 2014

(54) FLEXIBLE MODELING CONCEPT FOR DISCRETELY SIMULATING AND IMPLEMENTING, IN PARTICULAR, MATERIAL PROCESSING AND DISTRIBUTION SYSTEMS

(75) Inventor: Wolfram Klein, Neubiberg (DE)

(73) Assignee: Siemens Aktiengesellschaft, Munich (DE)

( * ) Notice: Subject to any disclaimer, the term of this patent is extended or adjusted under 35 U.S.C. 154(b) by 1867 days.

(21) Appl. No.: 11/793,496

(22) PCT Filed: Nov. 11, 2005

(86) PCT No.: PCT/EP2005/055913
§ 371 (c)(1),
(2), (4) Date: Feb. 26, 2008

(87) PCT Pub. No.: WO2006/067000
PCT Pub. Date: Jun. 29, 2006

(65) Prior Publication Data
US 2008/0228453 A1    Sep. 18, 2008

(30) Foreign Application Priority Data

Dec. 21, 2004   (DE) .......................... 10 2004 061 540

(51) Int. Cl.
| | |
|---|---|
| G06G 7/48 | (2006.01) |
| G06F 7/00 | (2006.01) |
| G06N 5/02 | (2006.01) |
| G06F 17/50 | (2006.01) |
| G06Q 10/06 | (2012.01) |
| G06Q 10/08 | (2012.01) |
| B07C 3/00 | (2006.01) |

(52) U.S. Cl.
CPC ............ *G06F 17/5036* (2013.01); *G06Q 10/06* (2013.01); *G06Q 10/08* (2013.01); *B07C 3/00* (2013.01)
USPC .............. 703/6; 700/228; 700/229; 700/230; 706/47

(58) Field of Classification Search
CPC .... G06Q 10/08; G06Q 10/06; G06F 17/5036; B07C 3/00
USPC .......................... 703/6; 700/228–230; 706/47
See application file for complete search history.

(56) References Cited

U.S. PATENT DOCUMENTS

| | | | | |
|---|---|---|---|---|
| 5,812,992 | A | * | 9/1998 | de Vries ........................... 706/25 |
| 5,870,715 | A | * | 2/1999 | Belitz et al. ...................... 705/22 |
| 2002/0172195 | A1 | * | 11/2002 | Pekkala et al. ................. 370/360 |
| 2003/0115037 | A1 | * | 6/2003 | Sumida ........................... 703/22 |

(Continued)

FOREIGN PATENT DOCUMENTS

| | | |
|---|---|---|
| DE | 44 29 469 A1 | 2/1996 |
| DE | 102 40 338 A1 | 9/2003 |

OTHER PUBLICATIONS

Ulrich A. Nickel, Jorg Niere, "Modelling and Simulation of a Material Flow system", 2001.*

(Continued)

*Primary Examiner* — Omar Fernandez Rivas
*Assistant Examiner* — Angel Calle
(74) *Attorney, Agent, or Firm* — Staas & Halsey LLP

(57) ABSTRACT

A method for modeling conveyance or flows of material or other functional behaviors, particularly in the form of components that generate material actions; a method for modeling a system having components, particularly a postal item distribution system, and; the generation of a discrete component-oriented simulation model based on the modelings, particularly as a basis for components and/or system implementation. Modeling of each component is carried out on the basis of a flexible component model that takes the input behavior and the functional behavior of a component into account, and that two components at a time transfer discrete events or discrete material units to one another by using a general communications model, particularly by using communication types.

17 Claims, 3 Drawing Sheets

(56) References Cited

U.S. PATENT DOCUMENTS

Figure 1:
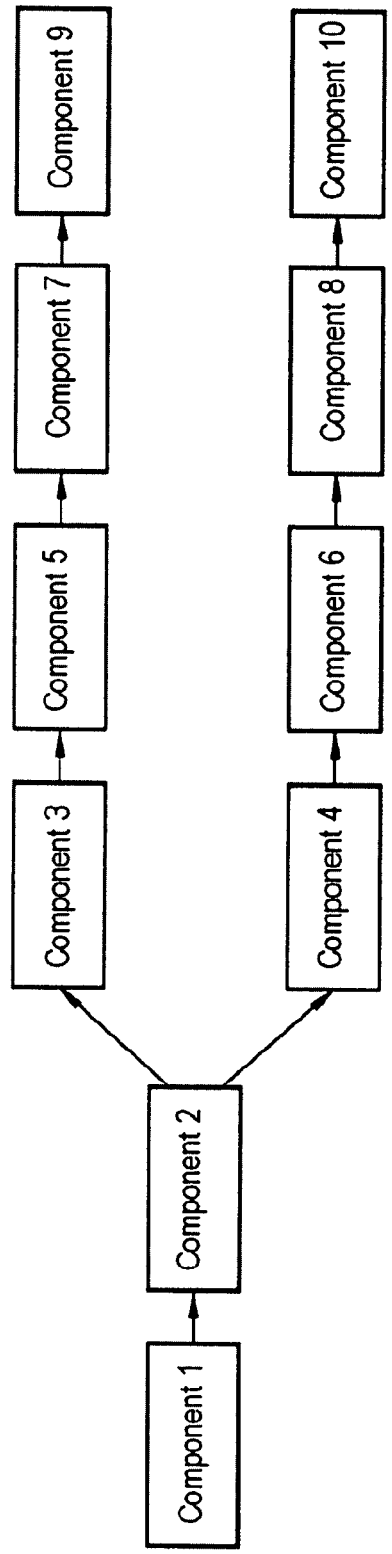

2003/0161303 A1* 8/2003 Mehrvar et al. ............... 370/386
2004/0100948 A1* 5/2004 Yang et al. .................... 370/380

OTHER PUBLICATIONS

Wolfgand Mueller-Wittig, Reginald Jegathese, Meehae Song, Jochen Quick, Haibin Wang, Yongmin Zhong, "Virtual Factory-Highly Interactive Visualisation for Manufacturing", 2002.*

Guixiu Qiao, Charles McLean, Frank Riddick, "Simulation system modeling for mass customization manufacturing", 2002.*

Ana R. Mendes, Ana L. Ramos, Ana S. Silmaria, Pedro M. Vilarinho, "Combining heuristic procedures and simulation models for balancing a PC camera assembly line", 2005.*

Guixiu Qiao, charles Mclean, and Frank Riddick, "Simulation System Modeling for Mass Customization Manufacturing", Winter simulation conference 2002.*

* cited by examiner

FLEXIBLE MODELING CONCEPT FOR DISCRETELY SIMULATING AND IMPLEMENTING, IN PARTICULAR, MATERIAL PROCESSING AND DISTRIBUTION SYSTEMS

CROSS REFERENCE TO RELATED APPLICATIONS

This application is based on and hereby claims priority to PCT Application No. PCT/EP2005/055913 filed on Nov. 11, 2005 and German Application No. 10 2004 061 540.3 filed on Dec. 21, 2004, the contents of which are hereby incorporated by reference.

BACKGROUND

The present application relates to a method for modeling transportation or material flows or components generating further functional behavior, in particular in the form of material actions, in particular a mail distribution system. Material action is defined in particular as mechanical, physical or chemical action on a material entity or, as the case may be, a separate medium. The present application also relates to a method for modeling a system having components of said type. Components and/or systems modeled in this way are used for generating discrete, component-oriented simulation models, in particular as a basis for component and/or system implementation.

Discrete, component-oriented simulation, of mail distribution centers for example, is based on the identification and corresponding modeling of said components as well as on the topological linking of the components. Components, in this context, can be conveyor belts, sorting machines, buffers, x-ray devices, unpacking and packing stations and the like. A topology of an installation can include, for example, components such as an unpacking station, through a conveyor belt, to a sorting machine, right through to a packing station. In this case each component type must be modeled from new or implemented accordingly. This is very costly, complex and time-consuming as well as inflexible.

In the prior type a modeling project was performed on the basis that each component type was thought through completely afresh or implemented from scratch. No account was taken of commonalities between component types. No traditional, standardized, flexible modeling concept exists as a basis of a simulation model.

SUMMARY

It is one possible object to provide a standardized, flexible concept for modeling and communication of topologically linked components as a basis of a discrete, component-oriented simulation model for implementing material flows and where applicable material actions. It is intended that a system created by these components shall be capable of being adapted in a simple, flexible and cost-effective manner to the material flow and material processing requirements in each particular case.

The inventor proposes modeling methods by which (new) adapted components and systems can be generated in a simple manner also contribute to the solution.

An advantage of this methodical approach is a significantly easier, more flexible and faster modeling of new component types.

The model of a component is basically subdivided into the three sub-models: input behavior, output behavior and functional behavior. When a component is adapted to a new functional behavior, the input behavior and the output behavior can at best remain unchanged. Components are generally defined as constituent parts of a whole, with the components of the present application in particular generating a discrete transportation or, as the case may be, discrete material flow—in contrast to the continuous flow of e.g. water—or acting in some other way on a material entity. A discrete material entity is in particular a self-contained, solid, in particular packaged, medium. Functional behavior is defined in this context in particular as a targeted, defined action on the medium, in particular the material entity (product). Functions can be transporting (e.g. boxes or parcels), sorting, buffering, x-raying, unpacking or packing, stamping, UV irradiating, etc. Transportation in this context generally defines the conveyance of a discrete solid material entity in three-dimensional space. With each function which is not simple transporting, a material entity is nonetheless transported along a specific path length corresponding to the length of a component. This knowledge can be used during the system modeling for saving on pure transport components, in particular with conveyor belts.

In this case the input behavior and the output behavior in particular are to be parameterizable such that they can also be used for other component types with similar functional behaviors. Being parameterizable, in this context, means generally that generalized assumptions of a particular behavior, in particular in the case of a simulation, can be made which are then adapted to the specific behavior through the choice of actual parameters. Using these parameters, which are either left constant or can vary within specific values, calculations can be performed. A parameter, in this context, is for example the number of ports or waiting areas or the speed of a conveyor belt.

The input behavior of a component relates to a parameterizable number of input ports, a parameterizable number of internal waiting areas, e.g. in the form of queues, and a model for a general mapping rule as to which input port is linked to which queue or which input ports are linked to which queues. By way of a general model for a mapping it can be specified which input stores incoming events in which queue. Standard models can be stored here. For example, input i always stores in queue i. Alternatively, input i always stores in the queue with the smallest number of waiting elements or, as the case may be, material entities. However, the mapping can also be programmable by way of stored tables, for example, and/or dynamically modifiable. By way of the input ports, components upstream thereof, seen topologically, can be linked to the current component or, as the case may be, its input behavior. Topology is generally defined as the teaching of the position and arrangement of geometric constructs in space, whereby in the present context the components of the present application represent the geometric constructs in space. Topology is therefore to be understood as meaning the spatial position and arrangement of the components in three-dimensional space or in a two-dimensional system.

The number of internal queues can optionally depend on the number of ports, but also on the type of communicated events. An event can be equated to a discrete material entity.

The output behavior of a component is likewise related to a parameterizable number of output ports, a parameterizable number of internal queues and a model for a general mapping rule as to which output port is linked to which queue or which ports are linked to which queues. The mapping rule between queues and associated output ports can depend in this case, in addition to the above, on properties of the event that is to be sent.

The functionality is similar to the input behavior of the component, whereby, in contrast to the input behavior, events are positioned according to a defined mapping from the queues into the ports. The number of output ports can optionally depend on the number of internal output waiting areas and/or on the type of events or, as the case may be, material entities that are to be sent.

The definition of the functional behavior itself, which is dependent on the component type, must be specified in concrete terms in each case. As already described in the foregoing, functions can be in particular transporting, sorting, buffering, x-raying, unpacking or packing, stamping, UV irradiating, automatic character recognition, etc. The cited functions are not to be understood in a restrictive sense. For example, manufacturing steps such as, for example, gluing, soldering, welding, casting, assembling, punching, drilling, milling, screwing, separating, surface machining which act on material entities in the form of products or product components, can also determine the functional behavior of a component or, as the case may be, a system.

The functional behavior of a component is only ever intended to be able to process one event. This means in particular that discrete material entities are processed sequentially, not simultaneously.

For this purpose two further sub-models in the form of mapping rules are important.

First, it must be defined which event is taken next from the input queues. It can be ruled, for example, that the event with the earliest arrival time is processed first (this corresponds to the first-in, first-out concept, or "FIFO"). Alternatively, the event with the highest priority can be given precedence in the processing.

Secondly, it must also be specified in which output queue the event is to be stored after it has been processed.

According to the modeling, components for generating transportation or a material flow or where applicable further functional behaviors, in particular in the form of a material action, can advantageously be generated. A component modeled according to the component model can be created flexibly and easily, in particular subsequently. A component includes in each case an input area having an input behavior, a function area having a functional behavior, and an output area having an output behavior.

In addition, the output behavior of component K(n) is to exchange discrete events with the input behavior of the component K(n+1) connected to it via what is referred to as a general communication model. For this reason a general communication model is proposed by which discrete events or discrete material entities can be transferred to one another. According to one embodiment, events or material entities are only transferred by components to succeeding components, with a discrete material flow being generated which cannot be inverted.

Two standard principles for communication are the push and the pull principles. With the push principle as a first type of communication, the preceding component K(n) is active and sends an event to the succeeding component K(n+1) when component K(n) has completed its processing.

With the pull principle as a second type of communication, the succeeding component K(n+1) is active and requests an event from component K(n) when component K(n+1) has completed its processing.

Component K(n) thereupon sends an event if it has finished processing an event or has an event in the corresponding output queue. Otherwise component K(n) makes a note of the request.

These principles or, as the case may be, communication types can be applied not only generally to the communication between two components, but also to each individual communication of just one event.

Furthermore the communication model is to be able to be extended in a flexible manner by further communication types. For example, communication types can be provided which take account of further operating states of components.

A general communication model is defined which on the one hand can switch arbitrarily or, as the case may be, according to parameterization between these two communication principles or communication types, either per component connection/component link or per event to be communicated/ material entity to be transferred.

Accordingly, a system for generating transportation or at least a material flow and where applicable functional behavior, in particular in the form of material actions, can be modeled in accordance with the general communication model. A system can have communication units for data exchange between two interlinked components in each case.

A component modeled according to the component model and/or a system modeled according to the communication model can advantageously be used for generating a discrete, component-oriented simulation model, in particular as the basis of a component and/or system implementation.

In the discrete simulation, two interconnected components K(n) and K(n+1) communicate with each other by exchanging events or material entities. In the case of a mail distribution center this can be for example parcels or letters.

BRIEF DESCRIPTIONS OF THE DRAWINGS

Figure 2:
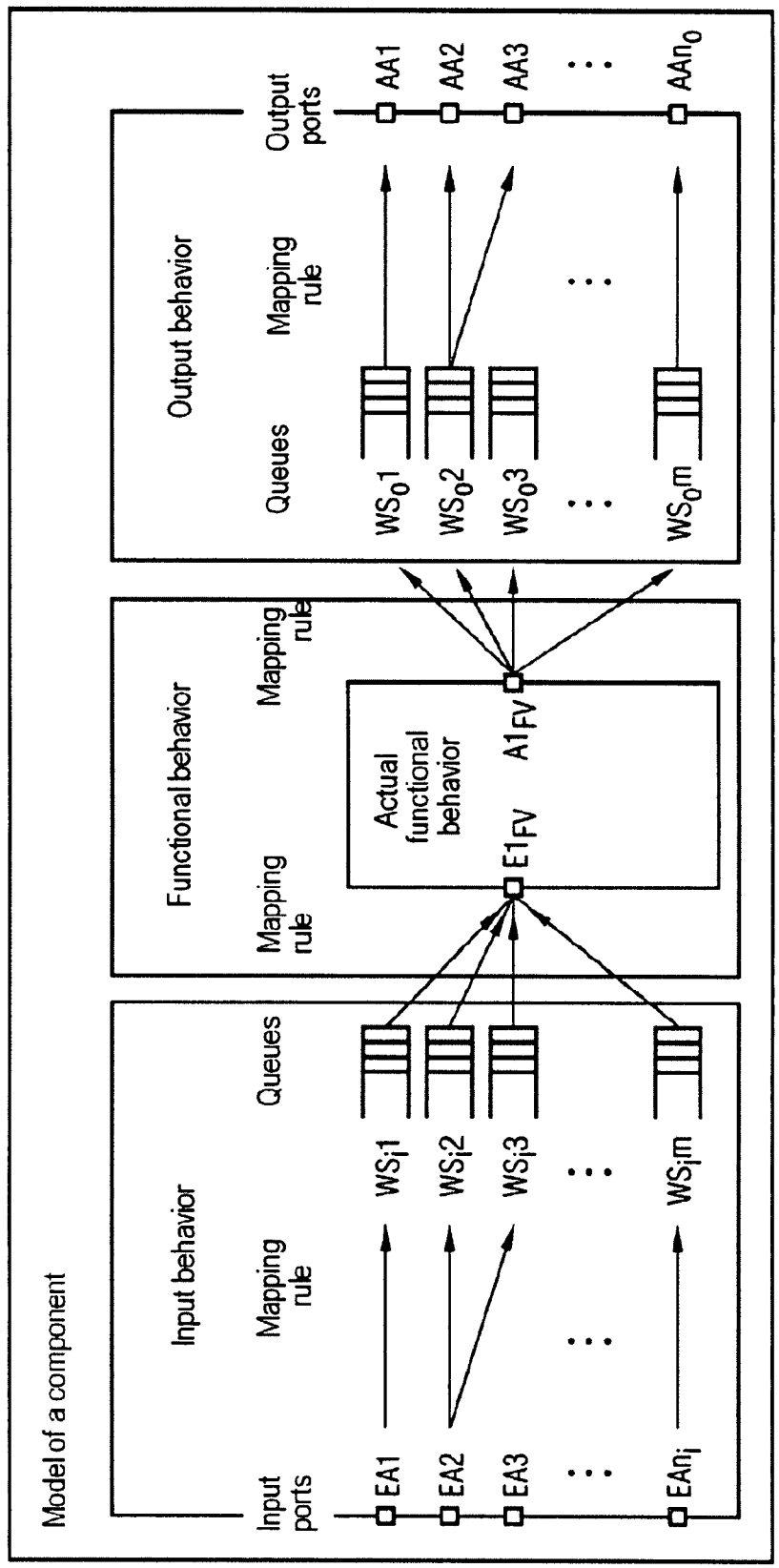
Figure 3:
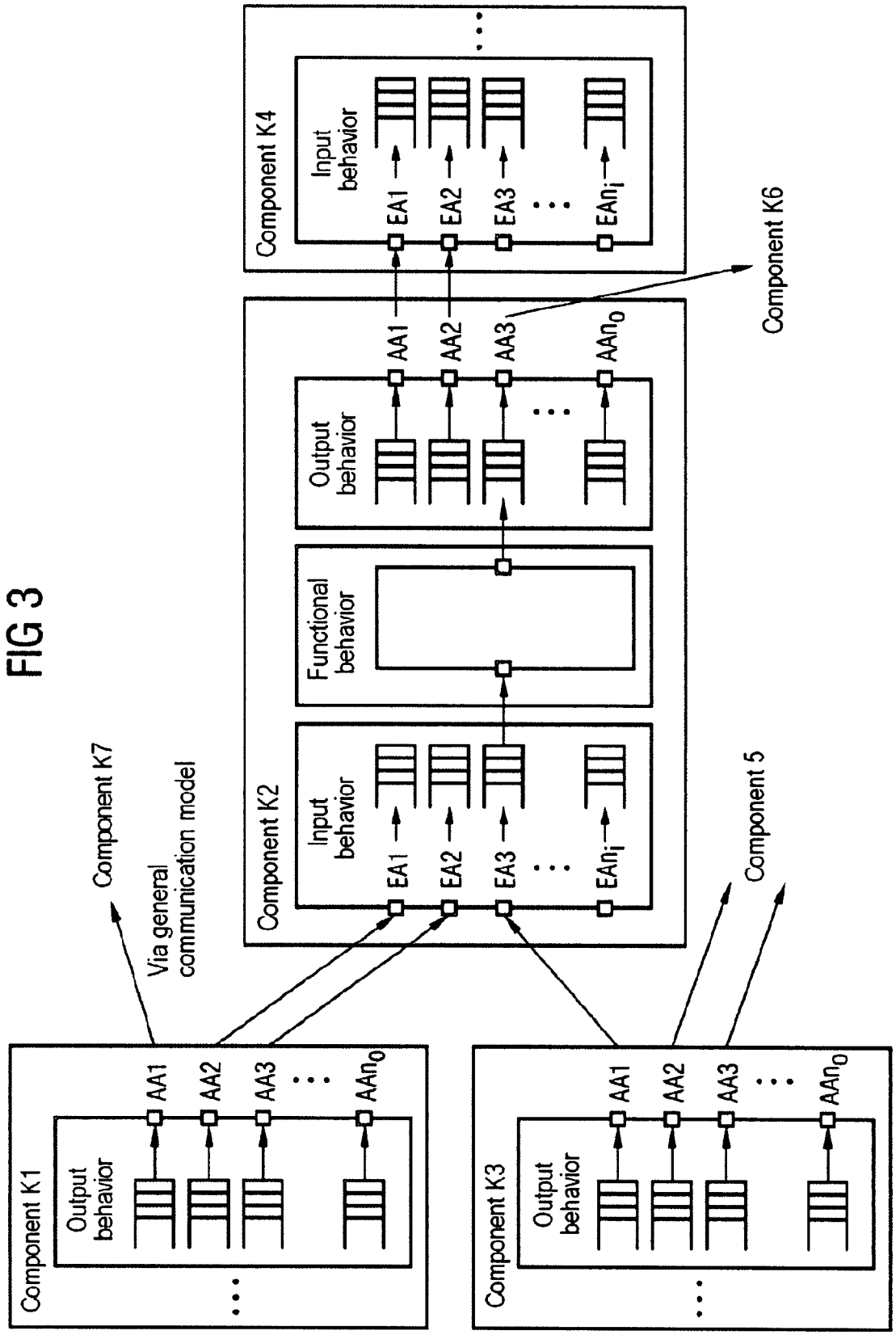

These and other objects and advantages of the present invention will become more apparent and more readily appreciated from the following description of the preferred embodiments, taken in conjunction with the accompanying drawings of which:

FIG. 1 shows an exemplary embodiment relating to the topological linking of components, FIG. 2 shows an exemplary embodiment relating to the component model, FIG. 3 shows an exemplary embodiment relating to the communication model.

DETAILED DESCRIPTION OF THE PREFERRED EMBODIMENT

Reference will now be made in detail to the preferred embodiments of the present invention, examples of which are illustrated in the accompanying drawings, wherein like reference numerals refer to like elements throughout.

FIG. 1 shows an exemplary embodiment relating to the topological linking of components. Each of the components has a functional behavior. Accordingly, events, i.e. material entities, which in this case are mail items in the form of letters or parcels, are processed. In this scenario, functional behavior is, in the case of a component 1, the generation of mail items; in the case of a component 2, the presorting of mail items; in the case of a component 3, the transporting of letters by a conveyor belt; in the case of a component 4, the transporting of parcels by a conveyor belt; in the case of a component 5, the sorting of letters; in the case of a component 6, the sorting of parcels; in the case of a component 7, the transporting of letters; in the case of a component 8, the transporting of parcels; in the case of a component 9 the packing of letters; and in the case of a component 10, the packing of parcels. After the component 2, the discrete material flow or, as the case may be, the discrete material entity flow is split into letters (component 3) and parcels (component 4) as discrete material entities. Workpieces or components, in particular in the production of goods, waste material entities, in particular in waste separation, samples that are to be analyzed chemically, in particular solid, liquid or gaseous material entities, or comparable discrete elements can be processed as discrete material entities.

FIG. 2 shows an exemplary embodiment relating to the component model. The input (Input) behavior on the left-hand side is defined by the input ports EA, the queues WSi and a mapping rule. The output (Output) behavior on the right-hand side is defined by the queues WSo, the output ports M, and a mapping rule. The functional behavior is defined by a mapping rule of input queues WSi to at least one input E of the function area and by a mapping rule of at least one output A of the function area to output queues WSo in addition to the function (e.g. stamping, pressing, punching, soldering, lasering, or other manufacturing steps).

FIG. 3 shows an exemplary embodiment relating to the communication model. Here, components K1, K2, K3 to K7 are positioned relative to one another according to a specific topology. Input ports EA of a component are coupled to output ports AA in the material flow of preceding components. The coupling can be implemented by way of material entity lines. According to a discrete simulation, two interconnected components communicate with each other by transferring events in the form of material entities. In the case of a mail distribution center, these can be parcels or letters for example. Other material entity transporting, distributing and processing systems can also be implemented. A queue WS can be provided, for example, in the form of an oblong parking area or as a rotating parking area. Other embodiments are equally conceivable.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide* v. *DIRECTV*, 69 USPQ2d 1865 (Fed. Cir. 2004).

The invention claimed is:

1. A method to model material flow between components of a package distribution system, comprising:
    modeling each component of the package distribution system, each component having an input behavior, an output behavior, and a functional behavior, the input behavior being described by a plurality of parameterizable input ports and a plurality of parameterizable internal input queuing areas and modeled by linking the input ports to the input queuing areas according to an input behavior mapping rule, the output behavior being described by a plurality of parameterizable internal output queuing areas and a plurality of parameterizable output ports and modeled by linking the output queuing areas to the output ports according to an output behavior mapping rule; and
    associating the output behavior of a preceding component with the input behavior of a succeeding component when the preceding and succeeding components are connected with an output-input relationship, wherein
    a general communication model employing communication types is used to model material flow between associated components, and
    according to the general communication model, the communication types are switchable for each component, for each component connection or for each change in material characteristics as the material is being transferred.

2. The method as claimed in claim 1, wherein the input behavior and the output behavior are parameterizable such that similar modeling can be used for components having similar functional behavior.

3. The method as claimed in claim 1, wherein the number of input queuing areas is dependent upon on the number of input ports or the type of the entity associated with the component or the functional behavior associated with the component.

4. The method as claimed in claim 1, wherein the number of output ports is dependent upon the number of internal output queuing areas or the type of material entity associated with the component or the functional behavior associated with the component.

5. The method as claimed in claim 1, wherein a functional behavior is specified for each discrete event or for each discrete material entity.

6. The method as claimed in claim 1, wherein the input behavior describes a processing order for material stored in the input queuing areas .

7. The method as claimed in claim 1, wherein the output behavior describes an output queuing area that stores material processed by the component.

8. The method as claimed in claim 1, wherein according to a first communication type, the preceding component, on completion of the respective functional behavior, sends the material to the succeeding component.

9. The method as claimed in claim 1, wherein according to a second communication type, the succeeding component requests new material from the preceding component when the succeeding component finishes processing old material.

10. The method as claimed in claim 9, wherein the succeeding component sends the preceding component a request when the succeeding component is ready for new material,
    the preceding component sends the new material if it is available, and
    the preceding component stores the request if the preceding component has not yet finished processing the new material.

11. The method as claimed in claim 1, wherein according to the general communication model, the communication types are modifiable.

12. The method as claimed in claim 1, wherein according to the general communication model, the communication types are switchable.

13. The method as claimed in claim 1, wherein the functional behavior is defined a specific processing function and by mapping the input queuing areas to at least one input of a function area including the functional behavior and mapping at least one output of the function area with the output queuing areas.

14. The method as claimed in claim 1, wherein the functional behavior is defined by mapping the input queuing areas to at least one input of a function area including the functional behavior and mapping at least one output of the function area with the output queuing areas.

15. A package distribution system, used for transporting material, wherein the distribution system is modeled according to the general communication model of claim 1.

16. A component modeled to represent a material flow function associated with the component, comprising:
- an input unit having an input behavior, the input behavior being described by a plurality of parameterizable input ports and a plurality of parameterizable internal input queuing areas and modeled by linking the input ports to the input queuing areas according to an input behavior mapping rule;
- a function unit having a functional behavior to process an event or a material;
- an output unit having an output behavior, the output behavior being described by a plurality of parameterizable internal output queuing areas and a plurality of parameterizable output ports and modeled by linking the output queuing areas to the output ports according to an output behavior mapping rule; and
- a connection unit that connects each of the input unit and the output unit to a respective adjacent entity having an input-output relationship with the component, wherein
- a general communication model employing communication types is used to model material flow between associated components, and
- according to the general communication model, the communication types are switchable for each component, for each component connection or for each change in material characteristics as the material is being transferred.

17. A discrete, component-oriented simulation model of a package distribution system having components modeled according to claim 16.

* * * * *